US009954165B2

(12) United States Patent
Cho et al.

(10) Patent No.: US 9,954,165 B2
(45) Date of Patent: Apr. 24, 2018

(54) SIDEWALL SPACERS

(71) Applicant: HEWLETT PACKARD ENTERPRISE DEVELOPMENT LP, Houston, TX (US)

(72) Inventors: Hans S. Cho, Palo Alto, CA (US); Yoocharn Jeon, Seoul (KR)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/500,085

(22) PCT Filed: Jan. 9, 2015

(86) PCT No.: PCT/US2015/010828
§ 371 (c)(1),
(2) Date: Jan. 30, 2017

(87) PCT Pub. No.: WO2016/111699
PCT Pub. Date: Jul. 14, 2016

(65) Prior Publication Data
US 2017/0244029 A1   Aug. 24, 2017

(51) Int. Cl.
*H01L 29/02*   (2006.01)
*H01L 45/00*   (2006.01)

(52) U.S. Cl.
CPC ........ *H01L 45/124* (2013.01); *H01L 45/1616* (2013.01); *H01L 45/1675* (2013.01)

(58) Field of Classification Search
CPC ............... H01L 45/124; H01L 45/1616; H01L 45/1675

USPC .......................................................... 257/2
See application file for complete search history.

(56) References Cited

U.S. PATENT DOCUMENTS

| 7,576,350 B2 | 8/2009 | Lowrey et al. |
| 2005/0112896 A1* | 5/2005 | Hamann ................. G11C 11/56 438/694 |
| 2005/0243630 A1 | 11/2005 | Hsu et al. |
| 2011/0155989 A1 | 6/2011 | Park et al. |
| 2013/0299916 A1 | 11/2013 | Won et al. |
| 2014/0091371 A1 | 4/2014 | Son et al. |
| 2014/0166965 A1 | 6/2014 | Seo et al. |

(Continued)

OTHER PUBLICATIONS

International Searching Authority, The International Search Report and the Written Opinion, PCT/US2015/010828, dated Sep. 30, 2015, 12 Pages.

(Continued)

*Primary Examiner* — Tu-Tu Ho
(74) *Attorney, Agent, or Firm* — Fabian VanCott

(57) ABSTRACT

In the examples provided herein, a device is described that has a stack of structure layers including a first structure layer and a second structure layer that are different materials, where the first structure layer is positioned higher in the stack than the second structure layer. The device also has a first sidewall spacer deposited conformally and circumferentially around an upper portion of the stack that includes the first structure layer. Further, the device has a second sidewall spacer deposited conformally and circumferentially around the first sidewall spacer and an additional portion of the stack that includes the second structure layer, where a height of the first sidewall spacer along the stack is different from a height of the second sidewall spacer.

20 Claims, 6 Drawing Sheets

(56) References Cited

U.S. PATENT DOCUMENTS

2014/0203236 A1    7/2014  Chen et al.
2014/0252295 A1    9/2014  Liao et al.
2014/0326941 A1   11/2014  Wells
2016/0359101 A1*  12/2016  Kuo ........................ H01L 43/08

OTHER PUBLICATIONS

Mann, R.W., et al., Silicides and Local Interconnections for High-performance VLSI Applications, Jul. 1995, IBM Journal Research Development, vol. 39, No. 4, pp. 403-417.

* cited by examiner

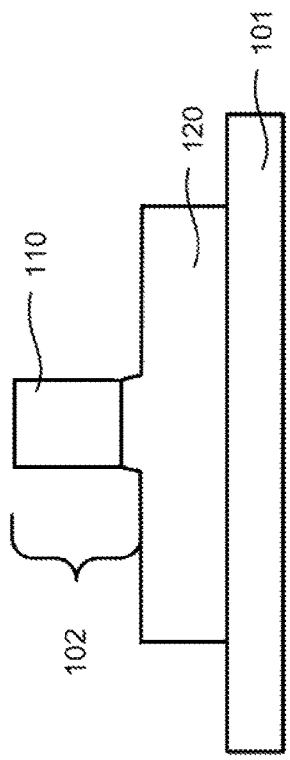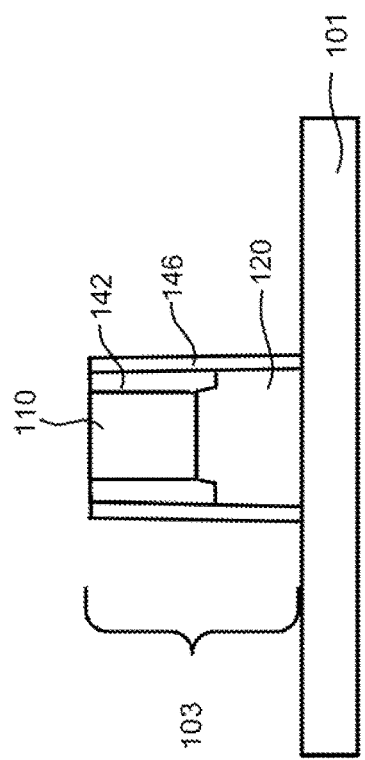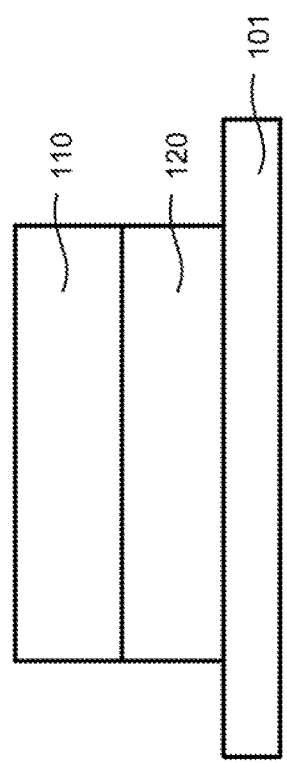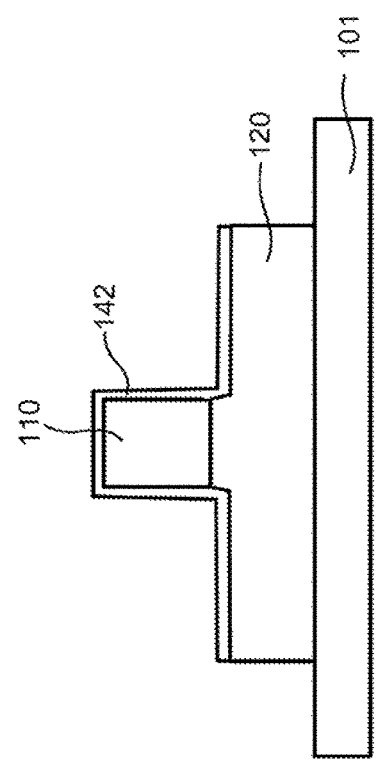

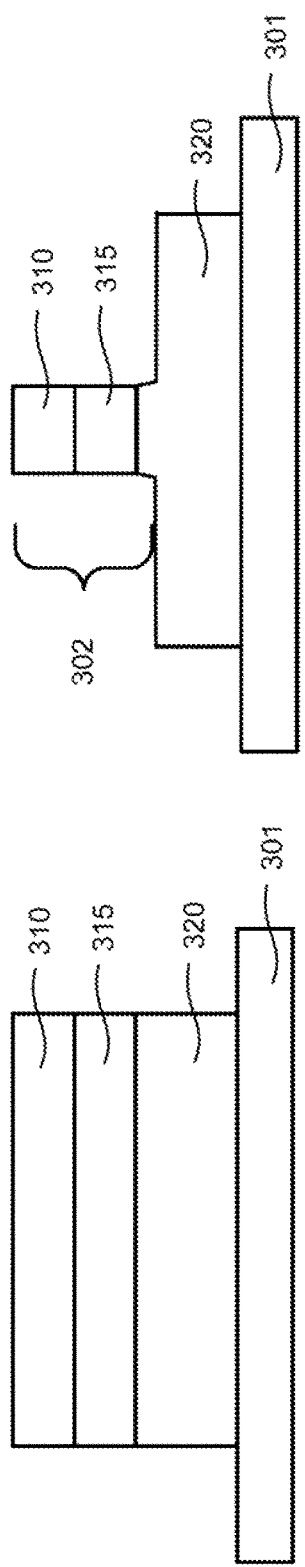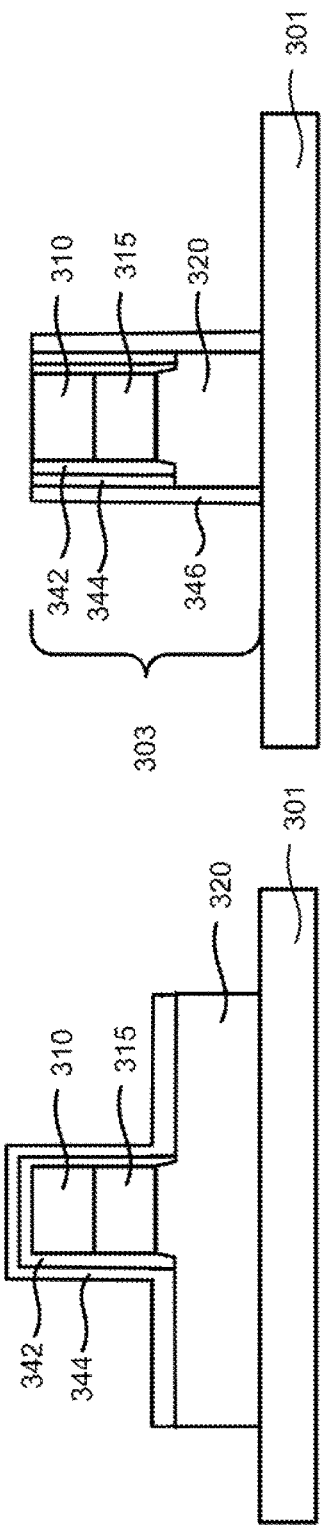

SIDEWALL SPACERS

BACKGROUND

A memristor cell is made of stacked layers of materials that exhibit memristive characteristics, such as non-volatile memristive resistance switching, volatile non-linear negative differential resistance switching, and metallic conduction. The memristor cell may be patterned and etched by lithographic processes to appropriate dimensions. To protect a memristor cell from subsequent processing steps, and/or to prevent chemical diffusion or electrical cross-talk, a sidewall spacer can be deposited on the sidewalls of the memristor cell.

BRIEF DESCRIPTION OF THE DRAWINGS

The accompanying drawings illustrate various examples of the principles described below. The examples and drawings are illustrative rather than limiting.

FIGS. 1A-1D depict fabrication steps for fabricating an example multi-layer structure with spacer sidewalls.

FIGS. 3A-3D depict fabrication steps for fabricating an example multi-layer structure with spacer sidewalls.

DETAILED DESCRIPTION

Figure 2A:
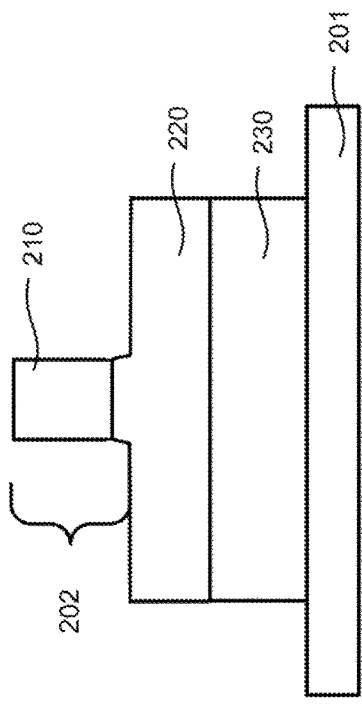
FIGS. 2A-2D depict fabrication steps for fabricating another example multi-layer structure with spacer sidewalls.

Examples of multi-layer structures, such as memristor cells, having multiple staggered conformal thin films deposited on the sidewalls of the layers of the structures are discussed. The conformal thin films are referred to herein as sidewall spacers. The height of the sidewall spacers increases sequentially toward the substrate on which the multi-layer structure is fabricated. Thus, different sidewall spacers make contact with different layers of the multi-layer structure along the height of the structure.

Techniques for fabricating such multi-layer structures with sidewall spacers having different heights are presented below. Top structure layers are etched, conformal thin films are deposited, and lower layers are subsequently anisotropically etched with additional conformal thin films deposited. The process of etching the structure layers with deposition of conformal thin films can be performed multiple times to produce staggered sidewall spacers down the height of the structure.

Sidewall spacers may be deposited on memristor cells or other fabricated structures. The material used for the sidewall spacers may be selected for specific reasons, such as to protect the structures from various subsequent processing steps to be performed on the structures, to prevent chemical diffusion, and/or to prevent electrical cross-talk.

Additionally, when a structure has multiple layers, and the multiple layers have different compositions and/or different properties, it may be beneficial to have sidewall spacers in contact with different levels of the structure made from different materials, so that the different layers of the structure may be treated differently and specifically for the properties of that layer. For example, memristive layers in a memristor cell exhibit memristive characteristics, such as non-volatile memristive resistance switching and volatile non-linear negative differential resistance (NDR) switching. The chemical composition of the sidewall spacers deposited on the layers of a memristor cell or the deposition conditions and source gases used in depositing the layers can effect or alter the properties of the memristor or the NDR films in the cell. For instance, deposition of a silicon oxide sidewall spacer leads to oxidation of the memristor and NDR films which increases the resistance and forming voltages of the cell, while depositing a silicon nitride spacer causes reactions that form metal nitrides on the sidewalls which act as detrimental low resistance leakage paths. Thus, it would be beneficial to deposit sidewall spacers with a specific composition and/or properties appropriate for contacting the different layers of the memristor cell.

FIGS. 1A-1D depict example fabrication steps for fabricating an example multi-layer structure with staggered spacer sidewalls having different heights along the structure. Cross-sections of the multi-layer structure are shown in FIGS. 1A-1D. In the example of FIG. 1A, a stack of structure layers is shown that includes a first structure layer 110 and a second structure layer 120. The structure layers may be fabricated on top of a substrate 101 with the second structure layer 120 fabricated first, and the first structure layer 110 fabricated on top of the second structure layer 120 such that the first structure layer 110 is positioned higher in the stack than the second structure layer. The first structure layer 110 and the second structure layer 120 may be different materials that vary in terms of one or more different properties, such as electrical properties, mechanical properties, or chemical properties.

The stack of structure layers in the example of FIG. 1A is etched to create a mesa 102, as shown in FIG. 1B. To form mesa 102, the first structure layer 110 is etched down through its entire thickness, while the second structure layer 120 is etched down through a portion of its thickness. As a result, the mesa 102 has a first height, where the first height is less than a height of the unetched stack of structure layers. In some implementations, the mesa 102 may take the form of a pillar, however the term mesa includes any etched shape of the structure layers. For example, the cross section of the mesa may be any geometrical shape, such as a square, rectangle, oval, or even an irregular shape. Further, the cross section of the mesa may not be uniform.

FIG. 1C shows that a first sidewall spacer 142 may be conformally and circumferentially deposited around sidewalls of an upper portion of the stack, i.e., the mesa 102, where the upper portion of the stack includes the first structure layer 110. The first sidewall spacer 142, as shown in the example of FIG. 1C, also covers the top of the mesa 102 and the non-mesa portion of the second structure layer 120. These portions of the first sidewall spacer 142 can be removed during subsequent processing.

The stack of structure layers may be etched to extend the height of the mesa 102 to an extended mesa 103 that is the height of the stack, as shown in FIG. 1D. FIG. 1D also depicts a second sidewall spacer 146 that is conformally and circumferentially deposited around the first sidewall spacer 142 and sidewalls of an additional portion of the stack that includes the rest of the second structure layer 120 that is not conformally covered by the first sidewall spacer 142. The upper portion of the stack may have a cross section that is smaller than a cross section of the additional portion of the stack.

As shown in the example of FIG. 1D, the height of the first sidewall spacer 142 along the stack is different from a height of the second sidewall spacer 146. That is, the first sidewall spacer 142 may be deposited down to a different depth from that of the second sidewall spacer 146. In the example of FIG. 1D, the height of the second sidewall spacer 146 is the height of the stack of structure layers. However, the second sidewall spacer 146 may be less than the height of the stack of structure layers, and a subsequently deposited sidewall spacer may be deposited that has the height of the stack of structure layers.

The examples of FIGS. 1A-1D show a multi-structure layer with two layers. However, the technique of depositing staggered sidewall spacers with different heights along the stack is applicable to a stack having any number of layers, and the number of different heights of deposited sidewall spacers is not limited to two. Further, a set of more than one sidewall spacer can be deposited at each sidewall spacer height.

Staggered sidewall spacers that have different heights along a multi-layer structure can be useful for different types of multi-layered elements besides memristor cells. For example, PN diodes and PIN diodes may be fabricated with spacer layers that protect the different layers of the diode that have different properties, i.e., the p-doped region, the n-doped region, and/or the intrinsic region. As another example, a sidewall spacer, such as a nitride spacer layer, can be applied to the polygate of a transistor to protect the polygate from oxidizing.

In some implementations, multiple sidewall spacers can be deposited at each sequentially etched depth of the mesa. For example, a third sidewall spacer may be deposited conformally around the first sidewall spacer 142, where the material of the third sidewall spacer has different properties from the material of the first sidewall spacer 142. Alternatively or additionally, a fourth sidewall spacer may be deposited conformally around the second sidewall spacer 146, where the material of the fourth sidewall spacer has different properties from the material of the second sidewall spacer. FIGS. 2A-2D depict example fabrication steps for fabricating an example multi-layer structure with three layers and a set of two sidewall spacers at each of two different depths. Cross-sections of the multi-layer structure are shown in FIGS. 2A-2D.

In the example of FIG. 2A, a stack of structure layers is depicted that includes a first structure layer 210, a second structure layer 220, and a third structure layer 230 fabricated on a substrate 201. Neighboring structure layers are different materials that have one or more different properties, such as electrical properties, mechanical properties, or chemical properties.

Figure 2B:
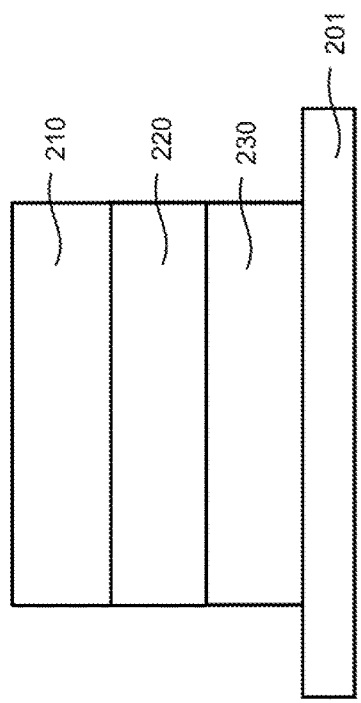

The stack of structure layers shown in the example of FIG. 2A is etched to create a mesa 202, as shown in FIG. 2B. To form mesa 202, the first structure layer 210 may be etched down through its entire thickness, while the second structure layer 220 may be etched down through a portion of its thickness. As a result, the mesa 202 has a first height, where the first height is less than a height of the unetched stack of structure layers. In some implementations, the mesa 202 can be etched down through a portion of the second structure layer 220.

Figure 2C:
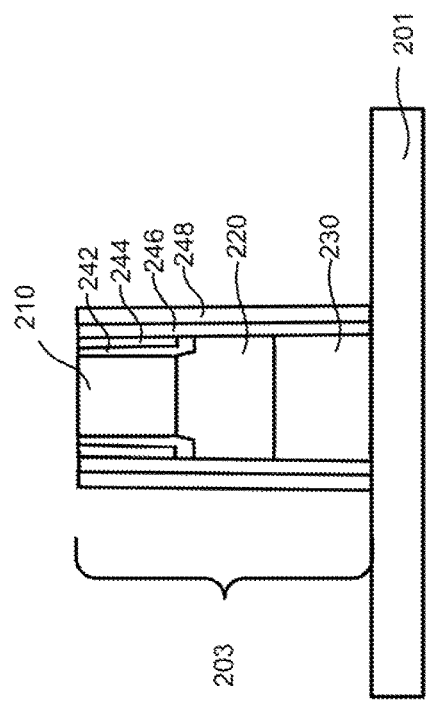

FIG. 2C depicts a first sidewall spacer 242 conformally and circumferentially deposited around an upper portion of the stack, i.e., the mesa 202, where the upper portion of the stack includes the first structure layer 210. Shown in the example of FIG. 2C is a second sidewall spacer 244 that is conformally and circumferentially deposited around the first sidewall spacer 242. A set of more than one sidewall spacer may be deposited with the same depth. For example, an inner sidewall spacer may protect the material of the stack from oxidation or other chemical processes, while an outer sidewall spacer may protect the material of the stack from physical damage or other chemical processes.

Figure 2D:
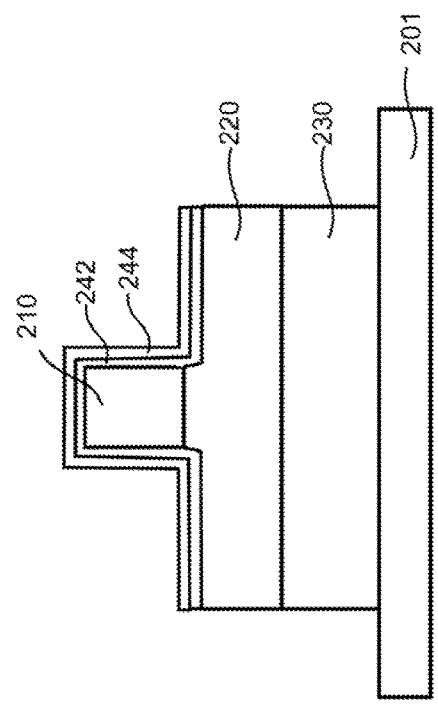

The stack of structure layers is etched to extend the height of the mesa 202 to an extended mesa 203 that is the height of the stack, as shown in FIG. 2D. FIG. 2D also shows that a third sidewall spacer 246 may be conformally and circumferentially deposited around the second sidewall spacer 244 and an additional portion of the stack. The additional portion of the stack may include the rest of the second structure layer 220 and the third structure layer 230 that has not been protected by the first sidewall spacer 242 and the second sidewall spacer 244. A dual set of sidewall spacers 246, 248 is shown deposited around the extended mesa 203. However, the set of sidewall spacers is not limited to two.

The example multi-layer structure depicted in FIG. 2D can be applicable to a memristor cell. In an example memristor cell, the first structure layer 210 may be a hard mask that is a first electrically conductive layer, such as titanium nitride, or a metallic conductor. The second structure layer 220 may be a selector layer, and the third structure layer 230 may be a memristive layer, where the selector layer and the memristive layer may be formed from different types of transition metal oxides. Transition metal oxides have an affinity for oxygen. Thus, it may be beneficial to have the metal oxides less than fully oxidized because with the dimensions of the memristor cell being on the order of tens of nanometers, oxidation on the edges of the memristor cell structure may alter the chemistry of the memristor cell. Accordingly, it may be desirable to select different materials for a sidewall spacer that contacts the hard mask layer and for a sidewall spacer that contacts the memristive layer.

FIGS. 3A-3D depict example fabrication steps for fabricating an example apparatus from a multi-layer structure with a set of sidewall spacers that includes an electrically conductive layer and an electrically insulating layer. Cross-sections of the multi-layer structure are shown in FIGS. 3A-3D.

In the example of FIG. 3A, a stack of structure layers is depicted that includes a first structure layer 310, a second structure layer 315, and a third structure layer 320 fabricated on a substrate 301. Neighboring structure layers are different materials that vary in terms of one or more different properties, such as electrical properties, mechanical properties, or chemical properties. In particular, the first structure layer 310 and the third structure layer 320 are electrically conductive, while the second structure layer 315 positioned between the first structure layer 310 and the third structure layer 320 is electrically insulating. Thus, the second structure layer 315 prevents electrical current from flowing between the first structure layer 310 and the third structure layer 320.

The stack of structure layers shown in the example of FIG. 3A is etched to create a mesa 302, as shown in FIG. 3B. To form mesa 302, the first structure layer 310 and the second structure layer 315 are etched down through their entire thicknesses, while the third structure layer 320 is etched down through a portion of its thickness. As a result, the mesa 302 has a first height, where the first height is less than a height of the unetched stack of structure layers. The mesa 302 is etched down through a portion of the third structure layer 330.

FIG. 3C depicts an electrically conductive spacer 342 deposited on sidewalls of the mesa 302 comprising the first electrically conductive structure layer 310, the second electrically insulating structure layer 315, and a portion of the third structure layer 320. Shown in the example of FIG. 3C is an electrically insulating spacer 344 deposited on the electrically conductive spacer 342 and on the non-mesa portions of the third structure layer 320. Additional sidewall spacers (not shown) can also be deposited at this height.

The stack of structure layers and sidewall spacer 344 is etched to extend the height of the mesa 302 to an extended mesa 303 that is the height of the stack, as shown in FIG. 3D. FIG. 3D also shows an additional spacer 346 deposited on the electrically insulating spacer 344 and on sidewalls of a remaining portion of the third electrically conductive layer 320. The remaining portion of the stack includes the rest of the third structure layer 320 that is not protected by the first sidewall spacer 342 and the second sidewall spacer 344.

The electrically conductive spacer 342 shown in the example of FIG. 3D provides an electrically conductive path between the first electrically conductive structure layer 310 and the third electrically conductive structure layer 320. Further the electrically insulating second structure layer 315 prevents the electrical current from flowing through the cross section of the memristor cell.

The example structure shown in FIG. 3D is applicable to memristor cells, where the third electrically conductive structure layer 320 is a memristive layer. With a memristor cell, there may be an additional structure layer, a selector layer, between the first electrically insulating structure layer 315 and the memristive layer.

Figure 4A:
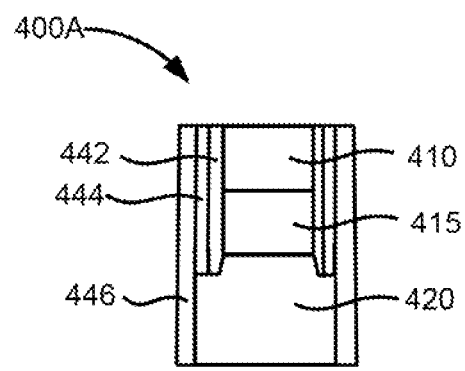
FIG. 4A shows a cross-section of an example apparatus with a multi-layer structure and sidewall spacers.

For example, FIG. 4A shows a cross-section of an example apparatus 400A with a multi-layer structure and sidewall spacers. The multi-layer structure includes a first electrically conductive layer 410; a memristive layer 420 below the first conductive layer; and an electrically insulating layer 415 between the first conductive layer 410 and the memristive layer 420. The apparatus also includes an electrically conductive spacer 442 deposited on sidewalls of the first electrically conductive layer 410, the electrically insulating layer 415, and a portion of the memristive layer 420 closest to the insulating layer 415; an electrically insulating spacer 444 deposited on the electrically conductive spacer 442; and an additional spacer 446 deposited on the electrically insulating spacer 444 and on sidewalls of a remaining portion of the memristive layer 420. The additional spacer 446 may have a different composition and/or properties from the electrically insulating spacer 444. The electrically conductive spacer 442 provides an electrically conductive path between the first electrically conductive layer 410 and the memristive layer 420.

Figure 4B:
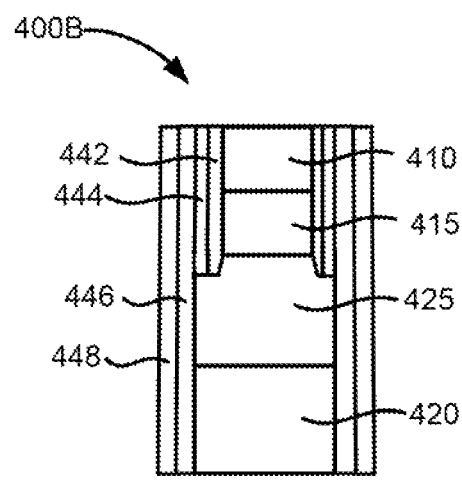
FIG. 4B shows a cross-section of another example apparatus with a multi-layer structure and sidewall spacers.

In some implementations, there can be a selector layer 425 between the electrically insulating layer 415 and the memristor layer 420, as shown in the example apparatus 400B in FIG. 4B, and the electrically conductive spacer 442 provides an electrically conductive path between the first electrically conductive layer 410 and the selector layer 425, rather than the memristive layer 420. Also shown in FIG. 4B is a second additional spacer 448 deposited over the additional spacer 446.

Figure 5:
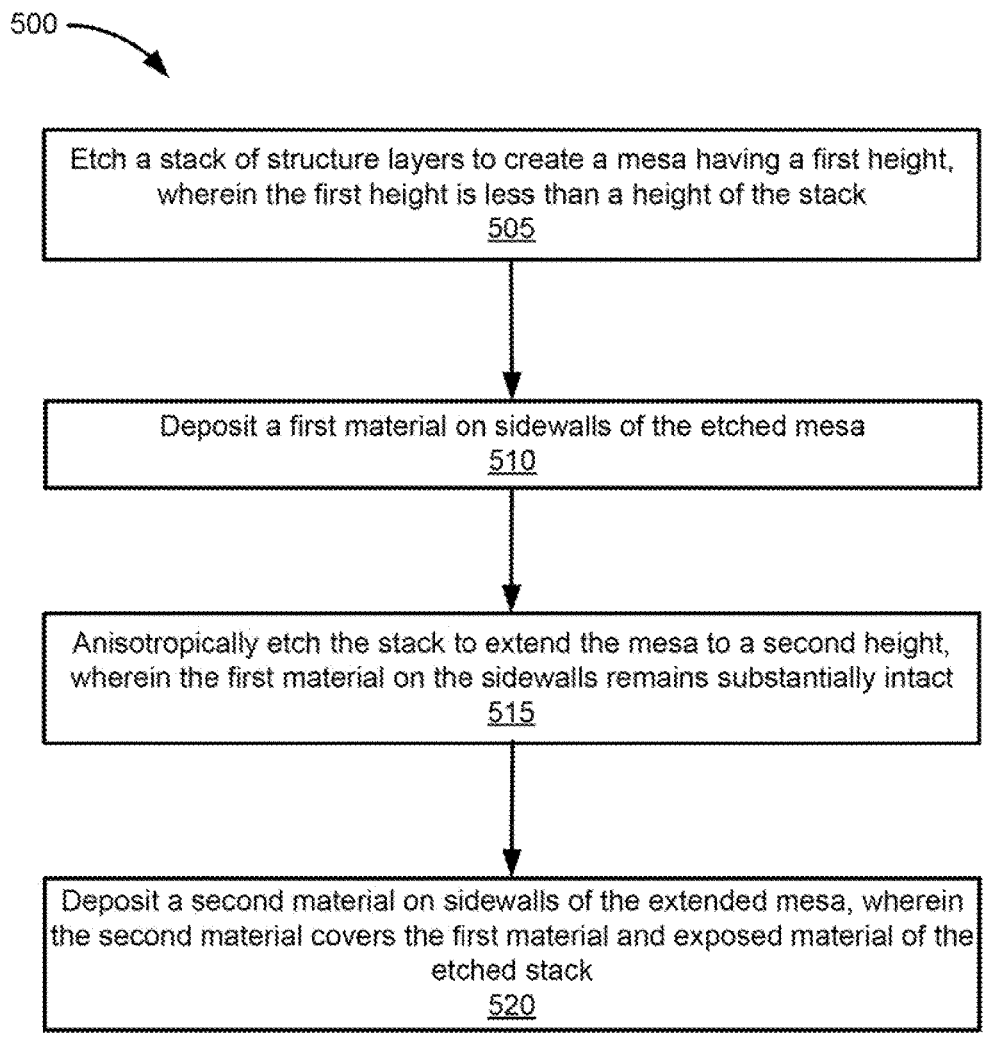
FIG. 5 depicts a flow diagram illustrating an example process of fabricating sidewall spacers on a stack of structure layers.

FIG. 5 depicts a flow diagram illustrating an example process 500 of fabricating sidewall spacers on a stack of structure layers. The stack of structure layers may be fabricated on a substrate. The process 500 begins at block 505 where the stack of structure layers may be etched to create a mesa having a first height, where the first height is less than a height of the stack.

At block 510, a first material may be deposited on sidewalls of the etched mesa. The first material may be deposited conformally to the sidewalls of the mesa. Depositing the first material may be performed with a process such as chemical vapor deposition, plasma-enhanced chemical vapor deposition, low-pressure chemical vapor deposition, atomic layer deposition, epitaxial deposition, and sputtering.

At block 515, the stack with the deposited first material may be anisotropically etched to extend the mesa to a second height. Anisotropic etching of the stack is a process that primarily etches the horizontal surfaces of the stack down toward the substrate while leaving the vertically oriented or nearly vertically oriented sidewalls of the stack substantially undisturbed. As a result, the first material deposited on the sidewalls of the mesa may remain substantially intact after the anisotropic etching occurs.

At block 520, a second material may be deposited on sidewalls of the extended mesa, where the second material conformally covers the first material and the exposed material of the etched stack. Deposition may be performed using one of the processes given above. Thus, process 500 results in the creation of staggered sidewall spacers on a multi-layer structure.

Figure 6:
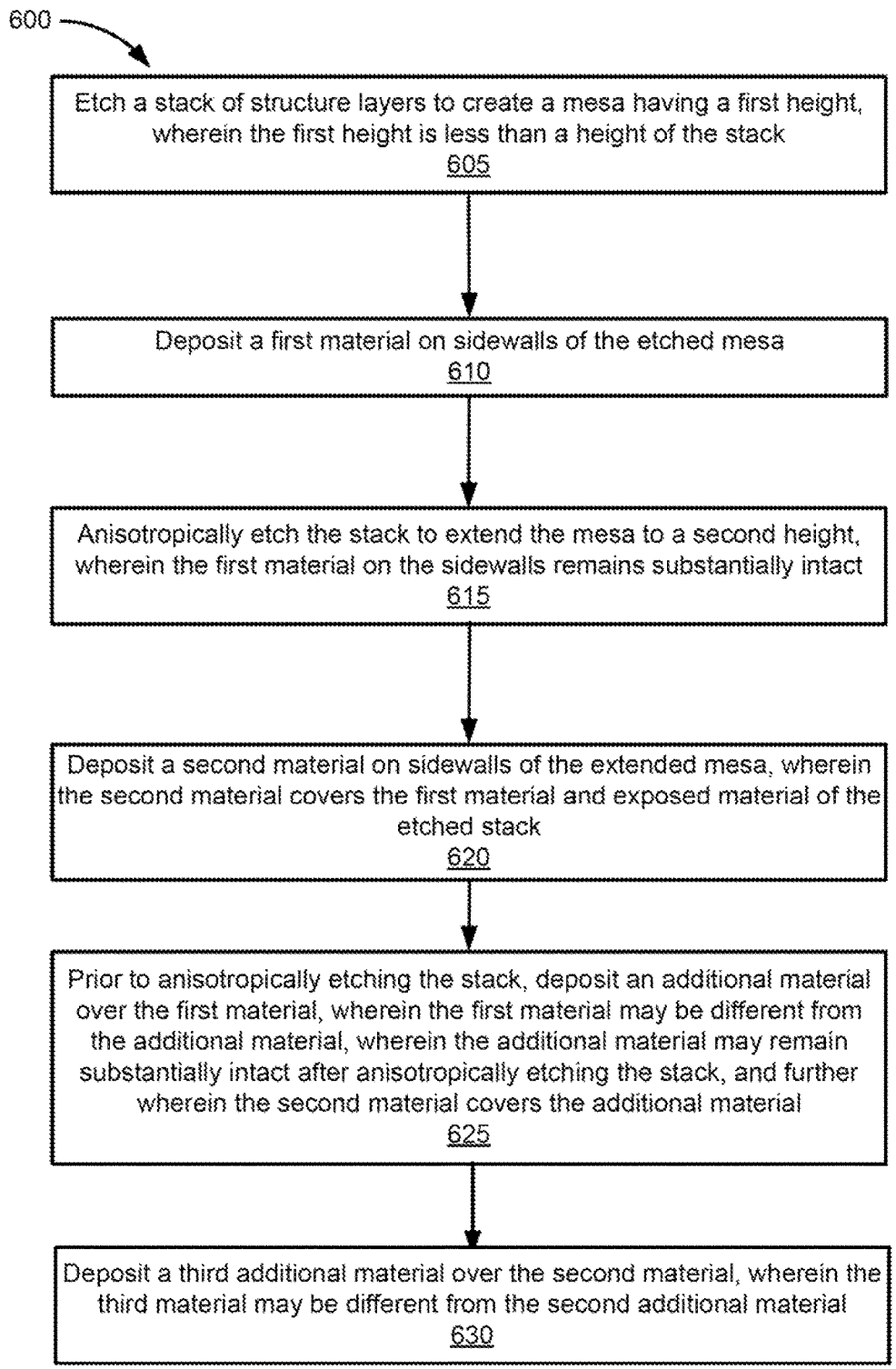
FIG. 6 depicts a flow diagram illustrating another example process of fabricating sidewall spacers on a stack of structure layers.

FIG. 6 depicts a flow diagram illustrating an example process 600 of fabricating sidewall spacers on a stack of structure layers. The process 600 begins at block 605 which may be similar to block 505 described with respect to the method 500 of FIG. 5. Blocks 610-620 may be similar to those described with respect to the method 500 of FIG. 5. For example, block 610 may be similar to block 510, block 615 may be similar to block 515, and block 620 may be similar to block 520.

At block 625, prior to anisotropically etching the stack, an additional material may be deposited over the first material. The first material may be different from the additional material, that is, the first material may have a different composition and/or different properties from the additional material. Also, the additional material may remain substantially intact after anisotropically etching the stack, and the second material covers the additional material.

At block 630, a third additional material may be deposited over the second material, wherein the third material may be different from the second additional material. Thus, process 600 results in the creation of staggered sets of sidewall spacers on a multi-layer structure.

The description given in processes 500 and 600 are for the purpose of illustration, and it will be apparent to those skilled in the art that other fabrication steps and approaches are possible and fall within the scope of the disclosure.

What is claimed is:
1. A device comprising:
 a stack of structure layers including a first structure layer and a second structure layer that are different materials, wherein the first structure layer is positioned higher in the stack than the second structure layer;
 a first sidewall spacer deposited conformally and circumferentially around an upper portion of the stack that includes the first structure layer;
 a second sidewall spacer deposited conformally and circumferentially around the first sidewall spacer and an additional portion of the stack that includes the second structure layer, wherein a height of the first sidewall spacer along the stack is different from a height of the second sidewall spacer; and
a third sidewall spacer deposited conformally around the first or second sidewall spacer, wherein a height of the third sidewall spacer is equal to a height of the first sidewall spacer or the second sidewall spacer.

2. The device of claim 1, wherein the upper portion of the stack has a cross section that is smaller than a cross section of the additional portion of the stack.

3. The device of claim 1, further comprising the third sidewall spacer deposited conformally around the first sidewall spacer, wherein a material of the third sidewall spacer has different properties from a material of the first sidewall spacer.

4. The device of claim 1, further comprising a fourth sidewall spacer deposited conformally around the second sidewall spacer, wherein a material of the fourth sidewall spacer has different properties from a material of the second sidewall spacer.

5. The device of claim 1, wherein the stack of structure layers further includes a third structure layer below the second structure layer, wherein the first structure layer is a hard mask layer, and further wherein the second structure layer is a selector layer, and the third structure layer is a memristive layer.

6. The device of claim 5, wherein the first sidewall spacer comprises an electrically conductive path between the selector layer and an electrically conductive layer above the selector layer in the stack of structure layers.

7. The device of claim 1, wherein the height of the second sidewall spacer is the height of the stack of structure layers.

8. An apparatus comprising:
a multi-layer structure comprising:
    a first electrically conductive layer;
    a memristive layer below the first conductive layer; and
    an electrically insulating layer between the first conductive layer and the memristive layer;
an electrically conductive spacer deposited on sidewalls of the first electrically conductive layer, the electrically insulating layer, and a portion of the memristive layer closest to the insulating layer;
an electrically insulating spacer deposited on the electrically conductive spacer; and
an additional spacer deposited on the electrically insulating spacer and on sidewalls of a remaining portion of the memristive layer,
wherein the electrically conductive spacer provides an electrically conductive path between the first electrically conductive layer and the memristive layer.

9. The apparatus of claim 8, wherein the multi-layer structure further comprises:
an additional structure layer between the electrically insulating layer and the memristive layer,
wherein the first electrically conductive layer is a hard mask, and the additional structure layer is a selector, and
further wherein the additional spacer is further deposited on sidewalls of the additional structure layer.

10. The apparatus of claim 8, wherein the additional spacer has different composition and/or properties from the electrically insulating spacer.

11. A device comprising:
a stack of structure layers including a first structure layer and a second structure layer that are different materials, wherein the first structure layer is positioned higher in the stack than the second structure layer;
a first sidewall spacer deposited conformally and circumferentially around an upper portion of the stack that includes the first structure layer;
a second sidewall spacer deposited conformally and circumferentially around the first sidewall spacer and an additional portion of the stack that includes the second structure layer,
wherein a height of the first sidewall spacer along the stack is different from a height of the second sidewall spacer, and
wherein the first sidewall spacer comprises a material that is electrically conductive, and the second sidewall spacer comprises a material that is electrically insulating.

12. A method comprising:
etching a stack of structure layers to create a mesa having a first height, wherein the first height is less than a height of the stack;
depositing a first material on sidewalls of the etched mesa;
anisotropically etching the stack to extend the mesa to a second height, wherein the first material on the sidewalls remains substantially intact; and
depositing a second material on sidewalk of the extended mesa, wherein the second material covers the first material and exposed material of the etched stack;
wherein the first or second material alters the electrical properties of at least one of the structure layers in contact with that first or second material.

13. The method of claim 12, further comprising:
prior to anisotropically etching the stack, depositing a first additional material over the first material, wherein the first material is different from the first additional material, wherein the first additional material remains substantially intact after anisotropically etching the stack, and further wherein the second material covers the first additional material.

14. The method of claim 12, wherein the first material has different composition and/or properties from the second material.

15. The method of claim 13, further comprising depositing a second additional material over the second material, wherein the second material is different from the second additional material.

16. The method of claim 12, wherein depositing comprises one of the following: chemical vapor deposition, plasma-enhanced chemical vapor deposition, low-pressure chemical vapor deposition, atomic layer deposition, epitaxial deposition, and sputtering.

17. The method of claim 12, wherein the structure layers comprise a memristor.

18. The method of claim 12, wherein one of the structure layers is a memristive layer and the first material comprises silicon oxide to oxidize the memristive layer.

19. The method of claim 12, wherein one of the structure layers is a negative differential resistance (NDR) layer and the first material comprises silicon oxide to oxidize the NDR layer.

20. The method of claim 12, further comprising depositing a third material on sides of the first or second material, wherein a height of the third material is equal to a height of the first or second material.

* * * * *